(12) United States Patent
Zhang et al.

(10) Patent No.: US 7,358,175 B2
(45) Date of Patent: Apr. 15, 2008

(54) SERIAL THERMAL PROCESSOR ARRANGEMENT

(76) Inventors: Jian Zhang, 216 St. Paul St., Unit 301, Brookline, MA (US) 02446; Chunghsin Lee, 24 Bluejay Rd., Lynnfield, MA (US) 01940

( * ) Notice: Subject to any disclaimer, the term of this patent is extended or adjusted under 35 U.S.C. 154(b) by 278 days.

(21) Appl. No.: 11/148,936

(22) Filed: Jun. 9, 2005

(65) Prior Publication Data
US 2006/0032079 A1 Feb. 16, 2006

Related U.S. Application Data

(60) Provisional application No. 60/578,506, filed on Jun. 10, 2004.

(51) Int. Cl.
*H01L 21/44* (2006.01)

(52) U.S. Cl. ............... 438/612; 438/660; 438/907; 438/908; 257/E21.476

(58) Field of Classification Search ............... 438/612, 438/907, 908, 460
See application file for complete search history.

(56) References Cited

U.S. PATENT DOCUMENTS

| 6,065,481 | A * | 5/2000 | Fayfield et al. ............... 134/1.3 |
| 6,344,407 | B1 * | 2/2002 | Matsuki et al. ............. 438/613 |
| 6,732,911 | B2 * | 5/2004 | Matsuki et al. ............. 228/219 |
| 2005/0255685 | A1 * | 11/2005 | Zhang ........................ 438/613 |

* cited by examiner

*Primary Examiner*—Michael Lebentritt
*Assistant Examiner*—Angel Roman
(74) *Attorney, Agent, or Firm*—Don Halgren

(57) ABSTRACT

A serial thermal processing arrangement for treating a wafer of semiconductor material, the steps including: loading the wafer into a chamber at an initial station and purging the chamber with nitrogen gas; introducing formic acid vapor and nitrogen and heating the wafer at ambient; introducing a vacuum and heat onto the wafer; introducing formic acid vapor and nitrogen, heating the wafer at ambient; introducing nitrogen gas, and cooling the wafer at ambient; and lastly, unloading the wafer from its chamber.

2 Claims, 1 Drawing Sheet

SERIAL THERMAL PROCESSOR ARRANGEMENT

The present invention relates to a method of manufacturing semiconductor wafers and more particularly to a stepwise process of a machine utilized in the manufacture of semiconductor wafers, and is based upon U.S. Provisional Application Ser. No. 60/578,506 filed 10 Jun. 2004, and incorporated herein by reference.

BACKGROUND OF THE INVENTION

Description of the Prior Art

Formation of a solder bump on a semiconductor substrate takes place when the semiconductor device is formed during a plating method, a printing method and a solder ball melting method. The solder is melted and joined to the connected material which may be wires and conductors or the like. In most prior art manufacturing methods utilizing solder, flux is used which is deposited on the surface of the terminal and the wiring. The flux typically covers the deposited surface while activating the surface to prevent new oxidation. Typically the solder is melted on the deposited surface and spreads over that surface and in the process, dissolves a portion of the flux. Removal of that flux is one of the problems common to the prior art.

It is an object of the present invention to overcome the disadvantages of the prior art.

It is a further object of the present invention to eliminate the use of flux and therefore the elimination of flux coating, cleaning and drying thereof in a semiconductor treatment operation.

BRIEF SUMMARY OF THE INVENTION

The present invention relates to a method of manufacturing solder bumps and solder joints on a semiconductor material. The process involves the use of a rotary table having six positions or stations thereon. The table is arranged to rotate so as to present a material to be treated, such as a semiconductor wafer, at a series of locations which each control the temperature, pressure and atmosphere thereat.

The initial station where such devices such as the semiconductor wafers are loaded, is designated station #6 for the purposes of defining this invention. At that station, a wafer or substrate is loaded thereon and enclosed within an enclosed climate controlled housing at ambient atmospheric pressure. That housing or chamber is then purged with a nitrogen charge to ensure a low level of oxygen within that chamber at station #6.

The plate containing the wafer or substrate is rotated to the next position or first subsequent station which is designated station #1. The atmosphere in the chamber at station #1 is a formic acid vapor mixed with nitrogen. The wafer on the plate within the chamber, is heated by convection and/or conduction in a controlled manner. The processing temperature at this station #1 is controlled and regulated based upon the nature of the solder utilized for a particular run of wafers/semiconductors. The processing pressure within that chamber is atmospheric pressure. At station #1, the wafer is treated so as to remove its surface moisture, organic contamination, surface oxides, and is treated to also form inter-metallic layers in the solid phase or in the solid to liquid transition phase.

The wafer on the plate thus leaves #1 and is stepwise rotated to a subsequent station #2 by controlled rotation of the table on which the plate is disposed. The atmosphere in station #2 contains formic acid vapor mixed with nitrogen at atmospheric pressure. The wafer or substrate is heated by convection and/or conduction in a controlled manner. At station #2, solder on the wafer or substrate is melted. The heat treatment also removes the surface oxides and drives or forces the decomposed organic contamination within the solder bump or ball onto the surface of that molten solder. The process at station #2 thus matures the inter-metallic layer formation.

At station #3 of the serial thermal processor, the wafer transferred thereto by rotation of the transfer table, is again heated by convection and/or conduction. A vacuum mechanism within the chamber at this location provides a vacuum or negative pressure environment thereat. There is no other material added to the wafer at this station #3. Treatment at this particular station provides a vacuum which evacuates any voids or organic contamination from within the solder bump or ball while that solder is at the molten state. This process takes place during the pressure differential created by the vacuum mechanism at station #3.

The wafer or semiconductor element is subsequently rotated on the transfer table to station #4 where the ambient atmosphere pressure is formed of a formic acid vapor mixed with nitrogen gas. The wafer is further heated on its plate by convection and/or conduction in a regulated manner. This station forms the solder bumps or balls and thus repairs the surface which may have become roughened at the previous station #3 due to the eruption of voids thereat.

The wafer or semiconductor is then successively rotatively transferred to station #5 by the rotational table. The ambient atmosphere within the chamber at station #5 is pure nitrogen gas. The wafer is cooled on its plate by convection and/or conduction in a closely controlled manner within its chamber or housing. At station #5, the solder on the wafers or semiconductor components being treated is formed in bumps or balls and is solidified to provide the quench processing for such solidification. Station #5 also controls the grain formation of the solder comprising the bumps or balls.

The final step within the serial thermal processing portion of this wafer treatment, occurs when the wafer is sequentially rotated to station #6 where the treated wafer or substrate is unloaded from its chamber and a new untreated wafer substrate is then placed on that now vacant plate within the chamber for further sequential advance through the stations 1 through 6 on the treatment apparatus.

The processing parameters at each particular station are set so to cover all particular solders which may include high lead, eutectic, and lead free solder.

Station #1: temperature 100-350 degrees centigrade, pressure 760 torr, and a time of between 1-300 seconds ambient-favn (formic acid vapor and nitrogen) or nitrogen.

Station #2: temperature of 200-400 degrees centigrade, pressure 760 torr, and a time of 1-300 seconds ambient-favn or nitrogen.

Station #3: temperature 200-400 degrees centigrade, pressure less than 1 torr, a time of between 1-300 seconds, and ambient nothing.

Station #4: temperature 100-400 degrees centigrade, pressure 760 torr, a time of between 1-300 seconds, and ambient favn or nitrogen.

Station #5: temperature 20-400 degrees centigrade, pressure 760 torr, a time 1-300 seconds, and an ambient of nitrogen.

Station #6: temperature 20-30 degrees centigrade, pressure 760 torr, a time 1-300 seconds, and an ambient of air and/or nitrogen.

The reflowing of high lead, eutectic and lead free solders are completed with one treatment of formic acid, wherein that wafer configuration is treated by the introduction of formic acid into the chambers at certain stations at atmospheric pressure. Removal or minimizing the voids inside the solder during the solder reflow by the application of a vacuum occurs after the surface oxides have been reduced and the solder has been melted.

Solder reflow is important in the semiconductor manufacturing process. Such reflow accomplishes the reduction of surface oxides on the solder bumps or balls. It helps form the inter-metallic layer, it removes or minimizes the voids within the solder bumps or balls, the process forms molten solder compounds, and it permits the performing of shiny and spherical solder bumps or balls on the semiconductor wafer material.

Prior art machines are typically flux dispensers, reflow furnaces, and flux washers. Each particular solder material required to use a different flux and a different flux washing chemistry. Due to the nature of these materials and the chemicals, the machines of the prior art had to be designed to be suitable for the particular material and the particular chemistries. Due to the nature of fluxes utilized in the prior art, they adhere to the processing equipment and make that equipment very difficult to be cleaned. The use of fluxes requires a lot of chemical consumption and a lot of maintenance for the manufacturing process. In the prior art, the vacuum system was utilized to heat the solder, to inject formic acid, and to minimize the voids and also to form solder bumps or balls. By using a vacuum system for solder reflow, there or several disadvantages, such as the lack of heat transfer media. The heat transfer coefficient of solder is low, and low concentration of formic acid can be used to reduce the surface oxides, and no convection heat transfer can be used to form solder bumps or balls.

The present invention however, requires only one chemical, such as a formic acid, to effectively reduce the surface oxides of lead, tin, copper and silver. The formic acid may also be utilized to reduce surface oxides of high lead solders such as lead and tin compounds, eutectic solders, and lead free solder as well as silver, tin or silver and copper compounds.

By using a multi chamber machine such as utilized with the present invention, removal of moisture on the surface can be easily accomplished. Removal of surface oxides or the minimization of voids inside the solder bumps or balls may be accomplished. The forming of inter-metallic layer and a shiny smooth solder bump or ball is thus permitted in a multi-station rotating machine as of the present invention. Applying formic acid under atmospheric pressure, a large amount of formic acid molecules are available for the oxide reduction process.

By applying the formic acid under atmospheric pressure, mechanical system for delivery of the chemical is easy and controllable. Because of the atmospheric pressure utilized, the heating system is able to permit uniformed and controlled heating of a wafer or semiconductor thereon. Under atmospheric pressure, the transferring of heat away from the heating system to the solder is more efficient. This is especially true because the wafer size in modem semiconductor manufacturing is much larger and the system requirements are much higher.

The formation of solder bumps or balls are formed in a improved manner when it is done so under atmospheric pressure because the conduction by heating or cooling can be accomplished more efficiently. The initial heating and cooling of solder bumps or balls at atmospheric pressure and subsequent heating and applying of a vacuum at elevated temperatures permits the pressure inside of the voids to draw those voids to the surface. Such voids are then easily removed.

BRIEF DESCRIPTION OF THE DRAWINGS

The objects and advantages of the present invention will become more apparent when viewed in conjunction with the following drawing in which.

DETAILED DESCRIPTION OF THE INVENTION

Figure 1:
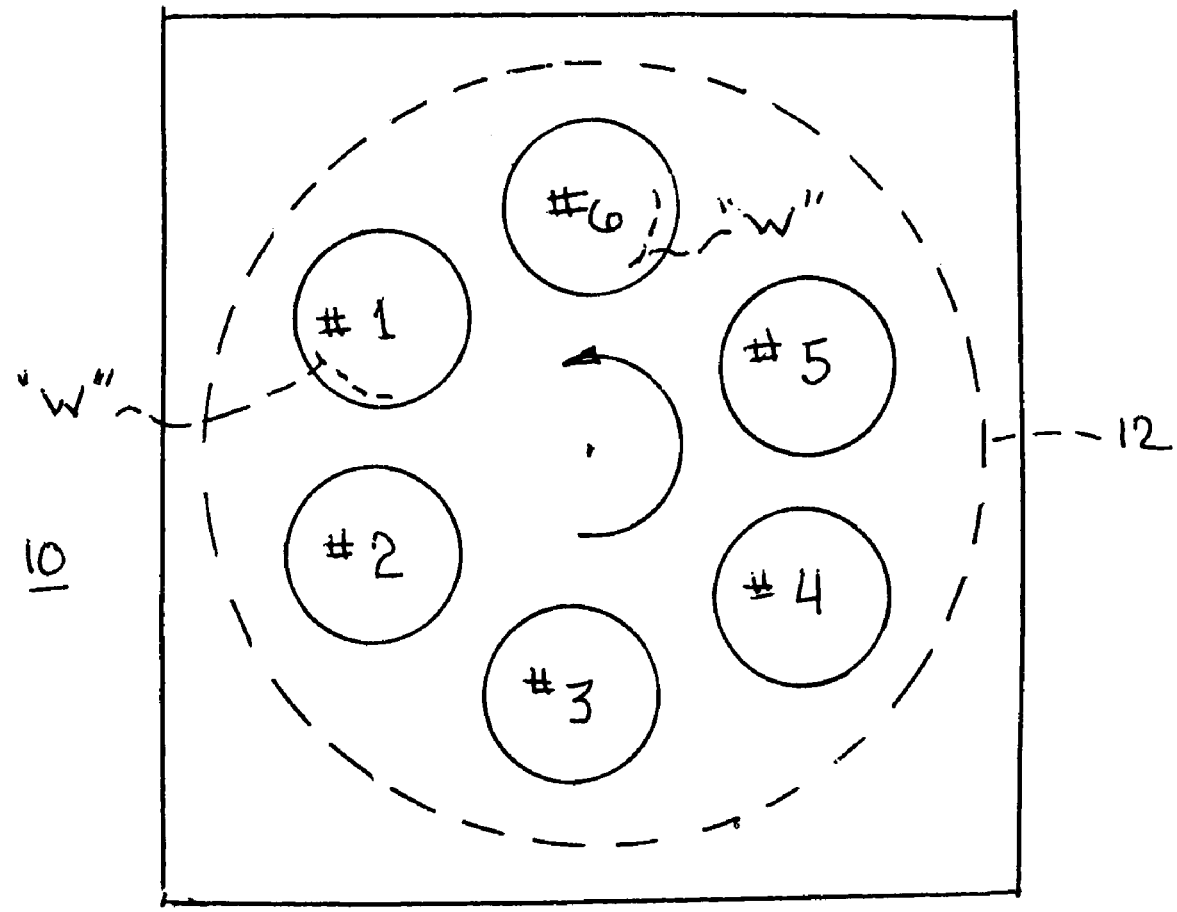
FIG. 1 is a plan view of a serial thermal process machine for the treatment of wafers and semiconductor material.

The invention comprises a serial thermal processing station arrangement 10 using a method for serially treating a wafer "W" of semiconductor material through a series of six station chambers in the processor arrangement 10. The method comprises one or more of the steps of: (1) loading the wafer into a chamber at an initial station #6 on a rotatable table 12 at atmospheric pressure and subsequently purging the chamber #6 with nitrogen gas; (2) rotating the wafer in the processor 10 to a first subsequent station chamber #1 in the processor 10, introducing formic acid vapor and nitrogen into the #1 chamber, heating the wafer at ambient atmospheric pressure in the chamber; (3) rotating the wafer to a second subsequent station chamber #2 in the processor 10, introducing formic acid vapor and nitrogen, heating the wafer at ambient atmospheric pressure at that #2 chamber station; (4) rotating the wafer to a third subsequent station chamber #3 in the processor 10, introducing a vacuum onto the #3 chamber holding the wafer, and heating the wafer in the absence of chemical treatment in this chamber #3 of the processor 10; (5) rotating the wafer to a fourth subsequent station chamber #4 in the processor, introducing formic acid vapor and nitrogen into the chamber at this station, heating the wafer in the chamber at ambient atmospheric pressure at this station; (6) rotating the wafer to a fifth subsequent station chamber #5 in the processor 10, introducing nitrogen gas into this #5 chamber, and cooling the wafer at ambient atmospheric pressure in this chamber; and (7) rotating the wafer back to a last or sixth subsequent station #6 where it was originally loaded, now however, for unloading the wafer from its chamber #6 and re-loading a fresh wafer therein.

The invention also includes loading a successive wafer "W'" into the chamber at the last or sixth station for a subsequent processing thereof.

The invention may also include a serial thermal processing arrangement for a semiconductor component comprising the step of: treating a semiconductor with a formic acid vapor in a controlled chamber at ambient atmosphere; and mixing the formic acid vapor with nitrogen gas.

We claim:

1. A serial thermal processing arrangement for treating a wafer of semiconductor material in a processor, comprising the steps of:

loading said wafer into a chamber at an initial station of said processor, on a rotatable table at atmospheric pressure and purging said chamber with nitrogen gas;

rotating said wafer to a first subsequent station, introducing formic acid vapor and nitrogen, heating said wafer at ambient atmospheric pressure;

rotating said wafer to a second subsequent station, introducing formic acid vapor and nitrogen, heating said wafer at ambient atmospheric pressure;

rotating said wafer to a third subsequent station, introducing a vacuum onto said wafer, heating said wafer in the absence of chemical treatment;

rotating said wafer to a fourth subsequent station, introducing formic acid vapor and nitrogen, heating said wafer at ambient atmospheric pressure;

rotating said wafer to a fifth subsequent station, introducing nitrogen gas, and cooling said wafer at ambient atmospheric pressure; and rotating said wafer to a last or sixth subsequent station for unloading said wafer from said chamber.

2. The serial thermal processing arrangement as recited in claim 1, including the step of:

loading a successive wafer into said last or sixth station for a subsequent processing thereof.

* * * * *